United States Patent
Kim et al.

(10) Patent No.: US 6,933,553 B2
(45) Date of Patent: Aug. 23, 2005

(54) FIELD EFFECT TRANSISTOR USING VANADIUM DIOXIDE LAYER AS CHANNEL MATERIAL AND METHOD OF MANUFACTURING THE FIELD EFFECT TRANSISTOR

(75) Inventors: Hyun Tak Kim, Daejeon (KR); Kwang Yong Kang, Daejeon (KR); Doo Hyeb Youn, Daejeon (KR); Byung Gyu Chae, Deajeon (KR)

(73) Assignee: Electronics and Telecommunications Research Institute (KR)

( * ) Notice: Subject to any disclaimer, the term of this patent is extended or adjusted under 35 U.S.C. 154(b) by 18 days.

(21) Appl. No.: 10/749,596

(22) Filed: Dec. 30, 2003

(65) Prior Publication Data

US 2004/0245582 A1 Dec. 9, 2004

(30) Foreign Application Priority Data

Jun. 3, 2003 (KR) .................. 10-2003-0035556

(51) Int. Cl.[7] .................. H01L 29/772; H01L 19/12
(52) U.S. Cl. .................. 257/310; 257/43; 257/192; 257/289; 257/410; 438/85; 438/86; 438/104
(58) Field of Search .................. 257/43, 192, 289, 257/310, 382–384, 410–414, 38–39; 438/85, 86, 104

(56) References Cited

U.S. PATENT DOCUMENTS 6,333,543 B1 * 12/2001 Schrott et al. .............. 257/410
6,624,463 B2 * 9/2003 Kim et al. .................. 257/310

OTHER PUBLICATIONS

D.M.Newns et al., "Mott transition field effect transistor", Applied Physc. Lett, (73) 1998, pp 780.*

C.Zhou et al., "A field effect transistor based on the MOtt transition in a molecular layer", Appl. Phys.Lett., (70), 1997, pp 598.*

* cited by examiner

*Primary Examiner*—Donghee Kang
(74) *Attorney, Agent, or Firm*—Blakely Sokoloff Taylor Zafman

(57) ABSTRACT

Provided is a field effect transistor. The field effect transistor includes an insulating vanadium dioxide (VO$_2$) thin film used as a channel material, a source electrode and a drain electrode disposed on the insulating VO$_2$ thin film to be spaced apart from each other by a channel length, a dielectric layer disposed on the source electrode, the drain electrode, and the insulating VO$_2$ thin film, and a gate electrode for applying a predetermined voltage to the dielectric layer.

9 Claims, 3 Drawing Sheets

FIELD EFFECT TRANSISTOR USING VANADIUM DIOXIDE LAYER AS CHANNEL MATERIAL AND METHOD OF MANUFACTURING THE FIELD EFFECT TRANSISTOR

BACKGROUND OF THE INVENTION

This application claims the priority of Korean Patent Application No. 2003-35556, filed on Jun. 3, 2003, in the Korean Intellectual Property Office, the disclosure of which is incorporated herein in its entirety by reference.

1. Field of the Invention

The present invention relates to a field effect transistor and a manufacturing method therefore, and more particularly, to a field effect transistor using an insulating vanadium dioxide layer as a channel material, and its manufacturing method.

2. Description of the Related Art

Among transistors, metal oxide semiconductor field effect transistors (MOSFETs) have currently become the leading choice of designers as ultra-small size and high speed switching transistors. MOSFETs employ a double pn-junction structure as a base structure, the pn-junction structure having a linear property at a low drain voltage. As the degree of integration of devices increases, the total channel length needs to be reduced. However, a reduction in a channel length causes various problems such as short channel effects. For example, when a channel length is reduced to approximately 50 nm or less, the size of a depletion layer increases, thereby the density of charge carriers changes, and current flowing between a gate and a channel increases.

To solve these problems, a study has been made on a field effect transistor using a Mott-Hubbard insulator, as a channel material, undergoing a Hubbard's continuous metal-insulator transition, that is, a second-order phase transition. A Hubbard's continuous metal-insulator transition was explained by J. Hubbard, in "Proc. Roy. Sci. (London) A276, 238 (1963), A281, 40-1 (1963)", and a transistor using the Hubbard's continuous metal-insulator transition is disclosed by D. M. Newns, J. A. Misewich, C. C. Tsuei, A, Gupta, B. A. Scott, and A. Schrott in "Appl. Phys. Lett. 73, 780 (1998)." Transistors using a Hubbard's continuous metal-insulator transition are called Mott-Hubbard field effect transistors or Mott field effect transistors. Mott-Hubbard field effect transistors perform on/off operation according to a metal-insulator transition. In contrast to MOSFETs, Mott-Hubbard field effect transistors do not include any depletion layer, and accordingly, can largely improve the degree of integration thereof. In addition, Mott-Hubbard field effect transistors provide a higher speed switching function than MOSFETs.

On the other hand, similarly to MOSFETs, Mott-Hubbard field effect transistors use a continuous metal-insulator transition. Therefore, when Mott-Hubbard field effect transistors are applied to ultra-small devices, they suffer a problem in that the amount of current decreases due to reduction in the area of devices. This is because charge carriers in general semiconductors are limited to a certain number.

SUMMARY OF THE INVENTION

The present invention provides a field effect transistor which induces a sharp metal-insulator transition by adding low-density holes to a vanadium dioxide thin film to control a large current even in devices having small areas.

The present invention also provides a method of manufacturing the field effect transistor.

According to an aspect of the present invention, there is provided a field effect transistor comprising: an insulating vanadium dioxide ($VO_2$) thin film used as a channel material; a source electrode and a drain electrode disposed on the insulating $VO_2$ thin film to be spaced apart from each other by a channel length; a dielectric layer disposed on the source electrode, the drain electrode, and the insulating $VO_2$ thin film; and a gate electrode for applying a predetermined voltage to the dielectric layer.

The $VO_2$ thin film may be disposed on a silicon substrate, a silicon-on-insulator (SOI) substrate, or a sapphire substrate.

The dielectric layer may be selected from the group consisting of $Ba_{1-x}Sr_xTiO_3$ ($0 \leq x \leq 0.6$), $Pb_{1-x}Zr_xTiO_3$ ($0 \leq x \leq 0.5$), $Ta_2O_3$, $Si_3N_4$, and $SiO_2$.

The source electrode, the drain electrode, and the gate electrode may be gold/chromium (Au/Cr) electrodes.

According to another aspect of the present invention, there is provided a method of manufacturing a field effect transistor, comprising: forming a $VO_2$ thin film on a substrate; forming a source electrode and a drain electrode on the $VO_2$ thin film to cover some portions at both right and left sides of the $VO_2$ thin film; forming a dielectric layer on the substrate, the source electrode, the drain electrode, and the $VO_2$ thin film; and forming a gate electrode on the dielectric layer.

The substrate may be selected from the group consisting of a single crystal silicon substrate, a SOI substrate, and a sapphire substrate.

The method may further comprise patterning the $VO_2$ thin film to have an area of several $\mu m^2$. The patterning may be performed using a photolithography process and a radio frequency (RF)-ion milling process.

The source electrode, the drain electrode, and the gate electrode may be formed using a lift-off process.

BRIEF DESCRIPTION OF THE DRAWINGS

The above and other features and advantages of the present invention will become more apparent by describing in detail exemplary embodiments thereof with reference to the attached drawings in which.

110: $Al_2O_3$ substrate, 120: $VO_2$ film, 130: Source Au/Cr electrode, 140: Drain Au/Cr electrode, 160: Gate Au/Cr electrode, 150: dielectric gate-insulator layer

DETAILED DESCRIPTION OF THE INVENTION

The present invention will now be described more fully with reference to the accompanying drawings, in which preferred embodiments of the invention are shown.

Figure 1:
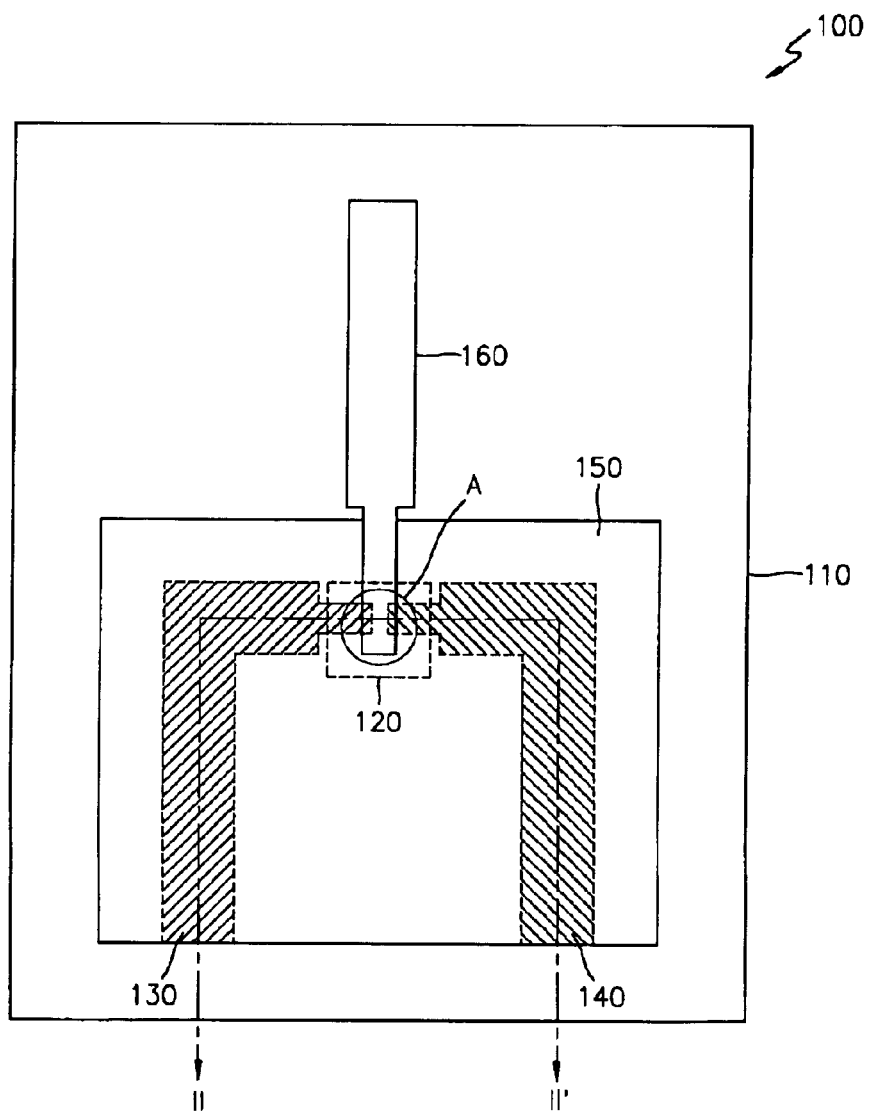
FIG. 1 is a plan view illustrating a layout of a field effect transistor according to the present invention.
Figure 2:
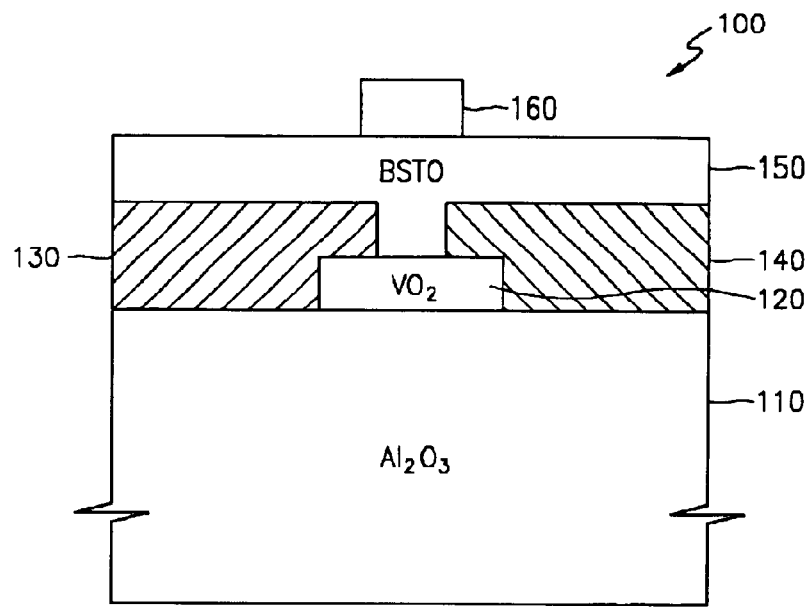
FIG. 2 is a cross-sectional view taken along the line II–II' of the field effect transistor shown in FIG. 1.
Figure 3:
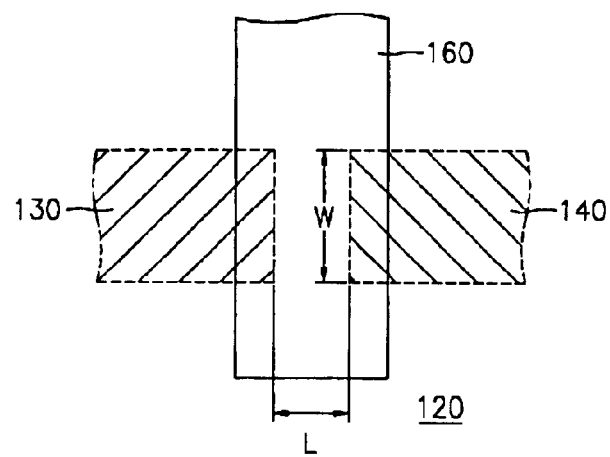
FIG. 3 is an enlarged plan view of a portion "A" of the field effect transistor shown in FIG. 1.

FIG. 1 is a plan view illustrating a layout of a field effect transistor according to the present invention. FIG. 2 is a cross-sectional view taken along the line II–II' of the field effect transistor shown in FIG. 1. FIG. 3 is an enlarged plan view of a portion "A" of the field effect transistor shown in FIG. 1.

Referring to FIGS. 1 through 3, a vanadium dioxide ($VO_2$) thin film 120 having a thickness of about 700–1000

Å and having a square pattern with an area of several μm is disposed on a single crystal sapphire ($Al_2O_3$) substrate 110. While the present embodiment employs the single crystal sapphire substrate 110 which provides suitable deposition conditions for growth of the $VO_2$ thin film 120, the present invention is not limited thereto. For example, a single crystal silicon (Si) substrate, or a silicon-on-insulator (SOI) substrate can be used, if necessary.

The $VO_2$ thin film 120 is a Mott-Brinkman-Rice insulator which is a paramagnetic insulator having a bound and metallic electronic structure. Meantime, generally known Mott insulators, namely, Moft-Hubbard-Insulators are anti-ferromagnetic insulators, differently from the Mott-Brinkman-Rice insulator. A difference between paramagnetic insulators and anti-ferromagnetic insulators is well explained by W. F. Brinkman and T. M. Rice in "Phys. Rev. B2, 4302 (1970)" which describe a Brinkman-Rice picture, and by J. Hubbard in "Proc. Roy. Sci. (London) A276, 238 (1963), A281, 40-1 (1963)" which makes a description based on the Hubbard theory, respectively. When low-density holes are added to Mott-Brinkman-Rice insulators, a Coulomb interaction decreases such that the Mott-Brinkman-Rice insulators undergo a sharp phase transition to metal. Accordingly, the Mott-Brinkman-Rice insulators are changed into non-uniform metallic systems having both a metallic phase and an insulating phase. Such a sharp phase transition is described by Hyun-Tak Kim in "Physica C 341–348, 259 (2000)," and by Hyun-Tak Kim in "New Trends in Superconductivity," Ed. J. F. Annet and S. Kruchinin, Kluwer, 2002, NATO Science Series Vol. II/67, p.137; cond-mat/0110112. Here, it was presented that the Mott-Brinkman-Rice insulator becomes a non-uniform metallic system because the number of electrons becomes less than the number of atoms due to addition of holes. In this case, the Moft-Brinkman-Rice insulator is transformed to a strongly correlated metal which locally follows a strongly correlated metal theory which is described by W. F. Brinkman and T. M. Rice in "Phys. Rev. B2, 4302 (1970)." The strongly correlated metal has an electronic structure which has one electron per one atom in s-energy band.

A first gold/chromium (Au/Cr) electrode 130 and a second Au/Cr electrode 140 are respectively formed as a source electrode and a drain electrode on some portions of the single crystal sapphire substrate 110 and the $VO_2$ thin film 120. The first Au/Cr electrode 130 and the second Au/Cr electrode 140 are spaced from each other by a channel length L and disposed on the $VO_2$ thin film 120 to face each other. As shown in FIG. 3, a distance between the first Au/Cr electrode 130 and the second Au/Cr electrode 140, that is, the channel length L is approximately 3 μm, and a channel width W is approximately 50 μm. While the Au/Cr metal thin films are used as the source electrode and the drain electrode in the present embodiment, a Cr film in the Au/Cr double metal film functions plays a rule of a buffer layer for good adhesion between the single-crystal sapphire-substrate 110 and an Au film, and has a thickness of about 50 nm.

While a $Ba_{1-x}Sr_xTiO_3$ ($0 \leq x \leq 0.6$) dielectric layer having a dielectric constant of about 43, for example, a $Ba_{0.5}Sr_{0.5}TiO_3$ (BSTO) dielectric layer 150 is disposed as a gate insulating layer on some portions of the first Au/Cr electrode 130, the second Au/Cr electrode 140, the remaining $VO_2$ thin film 120, and the sapphire substrate 110 as shown in FIG. 1. As a predetermined voltage is applied to the BSTO dielectric layer 150, charged holes are introduced into the $VO_2$ thin film 120 to cause a sharp metal-insulator transition in the $VO_2$ thin film 120 and thus form a conductive channel. Instead of the BSTO dielectric layer 150, other dielectric layers, for example, $Pb_{1-x}Zr_xTiO_3$ ($0 \leq x \leq 0.5$) and $Ta_2O_3$ having a dielectric constant higher than 200 can be used as the gate insulating layer. A third Au/Cr electrode 160 is formed as a gate electrode on the gate insulating layer 150 to apply a predetermined voltage to the BSTO dielectric layer 150.

Operation of the field effect transistor will be explained as follows.

Figure 4:
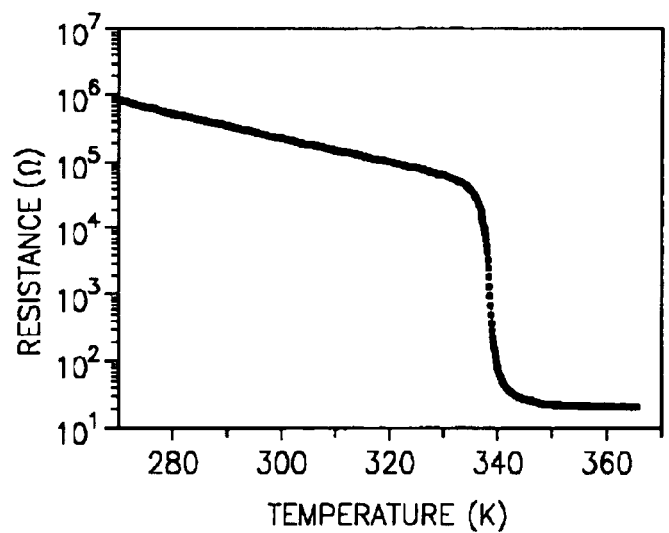
FIG. 4 is a graph illustrating changes with temperature in a resistance of a vanadium dioxide thin film in the field effect transistor shown in FIG. 1.

FIG. 4 is a graph illustrating changes with temperature in a resistance of the $VO_2$ thin film in the field effect transistor shown in FIG. 1.

Referring to FIG. 4, the $VO_2$ thin film is a Mott-Brinkman-Rice insulator as described above. Thus, resistance of the $VO_2$ thin film decreases logarithmically until a temperature increases to approximately 330K. However, when the temperature reaches approximately 340K, the resistance of the $VO_2$ thin film sharply decreases, thereby causing a phase transition to metal. The phase transition can occur at a normal temperature under specific conditions, that is, when predetermined potentials are generated on a surface of the $VO_2$ thin film and charged holes are injected into the $VO_2$ thin film.

In further detail, a bias of a predetermined level is applied to the first Au/Cr electrode 130 and the second Au/Cr electrode 140 to generate a potential of a predetermined level on the surface of the $VO_2$ thin film 120. Then, a voltage of a predetermined level is applied to the third Au/Cr electrode 160 to inject charged holes from the BSTO dielectric layer 150 into the $VO_2$ thin film 120. Therefore, the $VO_2$ thin film 120 into which the charged holes are injected undergoes a sharp metal-insulator transition to form a conductive channel, thereby causing current to flow between the first Au/Cr electrode 130 and the second Au/Cr electrode 140 through the conductive channel.

Figure 5:
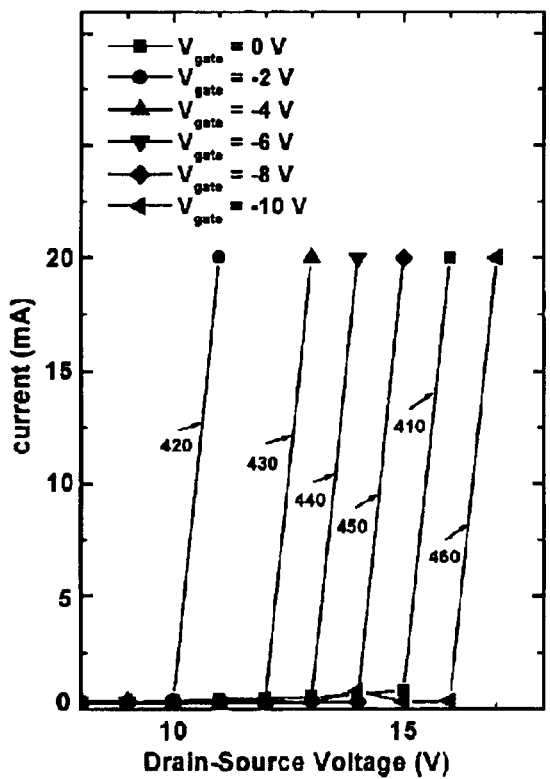
FIG. 5 is a graph illustrating operational characteristic of the field effect transistor shown in FIG. 1.

FIG. 5 is a graph illustrating operational characteristics of the field effect transistor according to the present invention.

Referring to FIG. 5, in the case of a line indicated by reference numeral 410, a gate voltage is not applied to the third gate Au/Cr electrode 160. When the drain-source voltage exceeds the value of 16V, the current increases abruptly to about 20 mA and the current density (J=200 mA current/cross-section) is about J≈$8 \times 10^5$ $A/cm^2$; this is a high current and an abrupt metal-insulator transition. In the case of lines respectively indicated by reference numerals 420, 430, 440, 450 and 460, gate voltages of −2V, −4V, −6V, −8V and −10V are respectively applied to the third gate Au/Cr electrode 160. As the gate voltage increases, the drain-source voltage increases; this is a characteristic of the present invention. The above experiment has limited the amount of current to 20 mA to protect the transistor. A method of manufacturing the field effect transistor will be explained below with reference to FIGS. 1 and 2.

First, the $VO_2$ thin film 120 is formed on the single crystal sapphire substrate 110 to have a thickness of about 700–10000 Å. A photoresist layer is coated on the $VO_2$ thin film 120 using a spin-coating technique, and the $VO_2$ thin film 120 is patterned through a photolithography process using a Cr-mask and an etching process. A radio frequency (RF)-ion milling process can be used as the etching process. The $VO_2$ thin film 120 is patterned to have an area of several μm².

Next, an Au/Cr layer is formed on the surface of the single crystal sapphire substrate 110, from which some portions of the $VO_2$ thin film are removed, and the square $VO_2$ thin film 120 to have a thickness of about 200 nm. The first Au/Cr electrode 130 and the second Au/Cr electrode 140 are formed to cover some portions at right and left sides of the $VO_2$ thin film 120 through a general lift-off process. The first Au/Cr electrode 130 and the second Au/Cr electrode 140 are spaced from each other by a channel length and disposed on the $VO_2$ thin film 120 to face each other. When some portions of the Au/Cr layer are removed through the lift-off process, care should be taken to obtain a channel having a length of 3 μm and a width of 10 μm. The channel length and width can vary, if necessary.

Next, the $Ba_{1-x}Sr_xTiO_3$ ($0 \leqq x \leqq 0.6$) dielectric layer 150 having a dielectric constant ε of about 43 is formed on the exposed surfaces of the single crystal sapphire substrate 110, the first Au/Cr electrode 130, the second Au/Cr electrode 140, and the $VO_2$ thin film 120. Next, the dielectric layer 150 is patterned to prominently show pads of the first Au/Cr electrode 130 and the second Au/Cr electrode 140. Here, other dielectric layers than the BSTO dielectric layer 150, for example, $Ba_{1-x}Sr_xTiO_3$ ($0 \leqq x \leqq 0.6$), $Pb_{1-x}Zr_xTiO_3$ ($0 \leqq x \leqq 0.5$), $Ta_2O_3$, $Si_3N_4$, and $SiO_2$ can be used. The third Au/Cr electrode 160 is formed as a gate electrode on the gate insulating layer 150. The third Au/Cr electrode 160 is formed in the same manner as the first and second Au/Cr electrodes 130 and 140.

As described above, a field effect transistor according to the present invention uses a $VO_2$ thin film having a metal-insulator-transition characteristic as a channel material, in contrast to the conventional art which uses a semiconductor material. Therefore, the field effect transistor of the present invention has an advantage in that it does not suffer limitations to a channel length, and accordingly, can improve the degree of integration thereof and a switching speed. The field effect transistor has another advantage in that it can selectively provide a larger current according to whether a gate voltage is applied in a state where a drain-source voltage is maintained constantly.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A field effect transistor comprising:
   an insulating vanadium dioxide thin film used as a channel material;
   a source electrode and a drain electrode disposed on the insulating vanadium dioxide thin film to be spaced apart from each other by a channel length;
   a dielectric layer disposed on the source electrode, the drain electrode, and the insulating vanadium dioxide thin film; and
   a gate electrode for applying a predetermined voltage to the dielectric layer.

2. The field effect transistor of claim 1, wherein the vanadium dioxide thin film is disposed on a silicon substrate, a silicon-on-insulator substrate, or a sapphire substrate.

3. The field effect transistor of claim 1, wherein the dielectric layer is selected from the group consisting of $Ba_{1-x}Sr_xTiO_3$ ($0 \leqq x \leqq 0.6$), $Pb_{1-x}Zr_xTiO_3$ ($0 \leqq x \leqq 0.5$), $Ta_2O_3$, $Si_3N_4$, and $SiO_2$.

4. The field effect transistor of claim 1, wherein the source electrode, the drain electrode, and the gate electrode are gold/chromium electrodes.

5. A method of manufacturing a field effect transistor, comprising:
   forming a vanadium dioxide thin film on a substrate;
   forming a source electrode and a drain electrode on the vanadium dioxide thin film to cover portions at both right and left sides of the vanadium dioxide thin film;
   forming a dielectric layer on the substrate, the source electrode, the drain electrode, and the vanadium dioxide thin film; and
   forming a gate electrode on the dielectric layer.

6. The method of claim 5, wherein the substrate is selected from the group consisting of a single crystal silicon substrate, a silicon-on-insulator substrate, and a sapphire substrate.

7. The method of claim 5, further comprising patterning the vanadium dioxide thin film to have an area of several $\mu m^2$.

8. The method of claim 7, wherein the patterning is performed using a photolithography process and a radio frequency-ion milling process.

9. The method of claim 5, wherein the source electrode, the drain electrode, and the gate electrode are formed using a lift-off process.

* * * * *